(12) United States Patent
Shigaki et al.

(10) Patent No.: US 11,609,499 B2
(45) Date of Patent: Mar. 21, 2023

(54) SILICON-CONTAINING COATING AGENT FOR PATTERN REVERSAL

(71) Applicant: NISSAN CHEMICAL CORPORATION, Tokyo (JP)

(72) Inventors: Shuhei Shigaki, Toyama (JP); Hiroaki Yaguchi, Toyama (JP); Makoto Nakajima, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 0 days.

(21) Appl. No.: 16/082,241

(22) PCT Filed: Feb. 10, 2017

(86) PCT No.: PCT/JP2017/004921
§ 371 (c)(1),
(2) Date: Sep. 4, 2018

(87) PCT Pub. No.: WO2017/145809
PCT Pub. Date: Aug. 31, 2017

(65) Prior Publication Data
US 2019/0339618 A1    Nov. 7, 2019

(30) Foreign Application Priority Data

Feb. 24, 2016 (JP) .............................. JP2016-033394

(51) Int. Cl.
| | | |
|---|---|---|
| G03F 7/075 | (2006.01) | |
| G03F 7/30 | (2006.01) | |
| G03F 7/36 | (2006.01) | |
| C08G 77/06 | (2006.01) | |
| C09D 183/04 | (2006.01) | |
| G03F 7/11 | (2006.01) | |
| C08G 77/16 | (2006.01) | |

(52) U.S. Cl.
CPC ............... *G03F 7/11* (2013.01); *C08G 77/06* (2013.01); *C08G 77/16* (2013.01); *C09D 183/04* (2013.01); *G03F 7/0758* (2013.01); *G03F 7/30* (2013.01); *G03F 7/36* (2013.01)

(58) Field of Classification Search
CPC ........ G03F 7/0757; G03F 7/0758; G03F 7/30; G03F 7/36; C08G 77/18; C08G 77/20; C08G 77/24; C08G 77/26; C08G 77/28
See application file for complete search history.

(56) References Cited

U.S. PATENT DOCUMENTS

| | | | |
|---|---|---|---|
| 9,181,402 | B2 | 11/2015 | Horstman et al. |
| 2004/0242013 | A1 | 12/2004 | Lyu et al. |
| 2006/0224009 | A1 | 10/2006 | Hamada et al. |
| 2008/0032061 | A1 | 2/2008 | Watanabe et al. |
| 2008/0038664 | A1 | 2/2008 | Hamada et al. |
| 2010/0029057 | A1 | 2/2010 | Iwasawa et al. |
| 2010/0092895 | A1 | 4/2010 | Zhang et al. |
| 2010/0167024 | A1* | 7/2010 | Natsume ............... G03F 7/0757 428/195.1 |
| 2010/0178620 | A1 | 7/2010 | Dei et al. |
| 2011/0011746 | A1 | 1/2011 | Brunner et al. |
| 2013/0075154 | A1* | 3/2013 | Saito ..................... H01L 23/057 174/536 |
| 2014/0170855 | A1* | 6/2014 | Nakajima ............... G03F 7/091 438/703 |
| 2015/0087772 | A1 | 3/2015 | Horstman et al. |
| 2015/0274973 | A1* | 10/2015 | Bae .......................... C08L 83/00 524/506 |
| 2015/0316849 | A1* | 11/2015 | Kanno .................... G03F 7/322 438/694 |
| 2015/0322212 | A1* | 11/2015 | Kanno ............. H01L 21/31133 438/703 |
| 2019/0051518 | A1* | 2/2019 | Shigaki ............... H01L 21/0332 |

FOREIGN PATENT DOCUMENTS

| | | |
|---|---|---|
| CN | 104114656 A | 10/2014 |
| CN | 104271641 A | 1/2015 |
| JP | 2004-359953 A | 12/2004 |
| JP | 2005-221534 A | 8/2005 |
| JP | 2005-336421 A | 12/2005 |
| JP | 2006-307180 A | 11/2006 |
| JP | 2008-266119 A | 11/2008 |
| JP | 2009-148670 A | 7/2009 |
| JP | 2010-020109 A | 1/2010 |
| JP | 2010-151923 A | 7/2010 |
| JP | 2011-118373 A | 6/2011 |
| JP | 2011-133679 A | 7/2011 |
| JP | 2015-038221 A | 2/2015 |
| WO | 2010/010928 A1 | 1/2010 |

OTHER PUBLICATIONS

Aug. 28, 2018 International Preliminary Report on Patentability issued in International Patent Application No. PCT/JP2017/004921.
Mar. 21, 2017 International Search Report issued in International Patent Application No. PCTJP2017/004921.
Dec. 2, 2019 Office Action issued in Chinese Patent Application No. 2017-80012899.0.
Mar. 29, 2019 Office Action issued in Chinese Application No. 201780012899.0.
Aug. 31, 2021 Office Action issued in Japanese Application No. 2018-501579.
May 4, 2022 Office Action issued in Korean Application No. 10-2018-7024387.

\* cited by examiner

*Primary Examiner* — John S Chu
(74) *Attorney, Agent, or Firm* — Oliff PLC (57) ABSTRACT

A composition for flattening uneven substrates. The composition for flattening uneven substrates, which is applied on an organic pattern, includes a solvent and a polysiloxane including a hydrolysis condensate of a hydrolyzable silane, wherein the polysiloxane includes silanol groups in a proportion of 20 mol % or less with respect to Si atoms, and the weight-average molecular weight of the polysiloxane is 1,000-50,000.

16 Claims, 2 Drawing Sheets

SILICON-CONTAINING COATING AGENT FOR PATTERN REVERSAL

TECHNICAL FIELD

The present invention relates to a composition for stepped substrate planarization, which is to be applied onto an organic pattern, and which contains a specific polysiloxane comprising a solvent and a hydrolysate condensation product of a hydrolyzable silane raw material, a method for producing the polysiloxane, and a method for producing a semiconductor device using the composition.

BACKGROUND ART

A technique for forming very fine patterns on a substrate and processing the substrate by etching it according to the patterns has been widely used in the field of semiconductor fabrication.

As a lithography technique is advancing, patterns used for the lithography are increasingly scaled down, and a KrF excimer laser and an ArF excimer laser have become used, and further, exposure techniques using an electron beam or an EUV light (extreme ultraviolet light) are being studied.

The technique for forming a pattern includes a pattern reversal method. A resist pattern is formed on a semiconductor substrate, and the resist pattern is coated with a silicon coating composition. Thus, the resist pattern is filled with the silicon coating composition, followed by baking, to form a coating film. Then, the resultant substrate is etched back by etching the upper portion of the silicon-containing coating film using a fluorine etching gas so that the upper portion of the resist pattern is bared. The etching gas is changed and the resist pattern is removed using an oxygen etching gas, so that the resist pattern disappears and a silicon pattern derived from the silicon coating film remains, to achieve a reversal of pattern.

Using the silicon film having formed therein a reverse pattern as an etching mask, the underlying layer or substrate is etched, so that the reverse pattern is transferred, to form a pattern on the substrate.

The method for forming a pattern using a reverse pattern includes an invention utilizing an ether solvent and a material using a polysiloxane which is obtained by cohydrolysis of tetraethoxysilane and a silane having a hydrogen atom, a fluorine atom, a linear or branched chain alkyl group having 1 to 5 carbon atoms, a cyano group, a cyanoalkyl group, an alkylcarbonyloxy group, an alkenyl group, or an aryl group (see Patent Literature 1).

Further, there is an invention utilizing a material using a hydrogensiloxane (see Patent Literature 2).

CITATION LIST

Patent Literature

Patent Literature 1: JP 2011-118373 A
Patent Literature 2: JP 2010-151923 A

SUMMARY OF INVENTION

Technical Problem

The present invention provides a method for coating a stepped substrate, which is advantageous in that a flat coating can be formed by a specific procedure on a stepped substrate having a difference in height and isolated and dense portions in a resist pattern formed on a substrate to be processed using a specific silicon-containing composition that can advantageously fill the resist pattern.

Solution to Problem

The present invention encompasses the followings.

[1] A composition for organic pattern planarization, which is to be applied onto an organic pattern, the composition comprising a solvent and a polysiloxane comprising a hydrolysate condensation product of a hydrolyzable silane raw material,
wherein the polysiloxane comprises a silanol group in a proportion of 20 mol % or less relative to Si atom, and
wherein the polysiloxane has a weight average molecular weight of 1,000 to 50,000.

[2] The composition according to [1] above, wherein the polysiloxane comprises a hydrolysate condensation product of a hydrolyzable silane raw material comprisings a hydrolyzable silane represented by the following formula (1):

[Chemical formula 1]

$$R^1_a Si(R^2)_{4-a} \qquad \text{Formula (1)}$$

wherein $R^1$ is bonded to the silicon atom through a Si—C bonding, and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group; $R^2$ represents an alkoxy group, an acyloxy group, or a halogen group; and a represents 1.

[3] The composition according to [2] above, wherein the polysiloxane comprises a hydrolysate condensation product of a hydrolyzable silane raw material comprising 100 to 50 mol %, preferably 95 to 50 mol % of the hydrolyzable silane represented by formula (1) wherein a is 1, and 0 to 50 mol %, preferably 5 to 50 mol % of the hydrolyzable silane represented by formula (1) wherein a is 2.

[4] The composition according to [2] or [3] above, wherein the polysiloxane is a dehydration treatment product with an alcohol and an acid of a hydrolysate condensation product of a hydrolyzable silane raw material comprising 0 to 100 mol %, preferably 1 to 100 mol % of the hydrolyzable silane of formula (1) wherein a is 0, and 0 to 100 mol %, preferably 0 to 99 mol % of the hydrolyzable silane of formula (1) wherein a is 1.

[5] The composition according to [2] or [3] above, wherein the polysiloxane is a treatment product with a non-alcohol and a base or a weak acid of a hydrolysate condensation product of the hydrolyzable silane raw material of formula (1) wherein a is 1 or 2.

[6] The composition according to [5] above, wherein the weak acid is an acid having an acid dissociation constant of 4 to 5.

[7] The composition according to any one of [1] to [6] above, wherein the organic pattern is selected from a resist pattern, a nanoimprinted pattern, and an organic underlayer film pattern.

[8] A method for producing a semiconductor device, comprising the steps of: (1) forming an organic pattern on a substrate, (3) applying the composition according to any one of [1] to [7] above to the organic pattern, and (4) etching the organic pattern to remove it so that a reverse pattern remains.

[9] A method for producing a semiconductor device, comprising the steps of: (1a) forming a resist on a substrate, (2) subjecting the resist to exposure and development, (3a)

applying the composition according to any one of [1] to [7] above to the resist pattern during or after the development, and (4a) etching the resist pattern to remove it so that a reverse pattern remains.

[10] The method according to [9] above, comprising, before step (1a), the step (1a-1) of forming a resist underlayer film on a substrate.

[11] The method according to [8] above, comprising, after step (3), the step (3-1) of etching back the surface of the coating film so as to bare a surface of the organic pattern.

[12] A method for producing a polysiloxane in a composition for application onto an organic pattern for stepped substrate planarization, comprising the step of dehydrating a hydrolysate condensation product of a hydrolyzable silane raw material with an alcohol and an acid, wherein the hydrolyzable silane raw material comprises 0 to 100 mol %, preferably 1 to 100 mol % of a hydrolyzable silane represented by the following formula (1):

[Chemical formula 2]

Formula (1)

wherein $R^1$ is bonded to the silicon atom through a Si—C bonding, and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group; $R^2$ represents an alkoxy group, an acyloxy group, or a halogen group; and a represents 0, and 0 to 100 mol %, preferably 0 to 99 mol % of a hydrolyzable silane represented by formula (1) wherein a is 1.

[13] A method for producing a polysiloxane in a composition for application onto an organic pattern for stepped substrate planarization, comprising the step of treating a hydrolysate condensation product of a hydrolyzable silane raw material represented by the following formula (1):

[Chemical formula 3]

Formula (1)

wherein $R^1$ is bonded to the silicon atom through a Si—C bonding, and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group; $R^2$ represents an alkoxy group, an acyloxy group, or a halogen group; and a represents 1 or 2 with a non-alcohol and a base or a weak acid.

Advantageous Effects of Invention

The composition for stepped substrate planarization (stepped substrate planarization composition) of the present invention coats a patterned organic underlayer film formed on a substrate to be processed without being mixed with the patterned organic underlayer film, so that the pattern of the organic underlayer film can be advantageously filled with the composition. In the present invention, by employing a material having a specific silanol group content and molecular weight, various fine and coarse patterns can be filled with a film of the material with flatness without a difference in thickness of the film. The stepped substrate planarization composition is cured to form a polysiloxane composition film, and the film is etched back later by etching (gas etching), so that a flat surface can be formed. Further, the organic underlayer film can be removed by ashing, and therefore a reverse pattern of the pattern in the organic underlayer film can be formed in the polysiloxane composition film formed from the stepped substrate planarization composition which had filled the pattern of the organic underlayer film. The substrate to be processed can be processed using the resultant reverse pattern.

As a conventional technique, there has been a method in which a photoresist pattern is filled with a polysiloxane composition, and then etched using an oxygen etching gas so as to form a reverse pattern of the photoresist in the polysiloxane. This method is disadvantageous in that the thickness of the resist is so small that a reverse pattern having a high aspect ratio cannot be obtained. By contrast, in the present invention, a reversal of pattern can be made by using a stepped substrate having a large aspect ratio, as compared to that of a photoresist pattern on a substrate to be processed, so that a reverse pattern having a high aspect ratio can be obtained. In the present invention, it is possible to fill a pattern of an organic underlayer film having a large aspect ratio with a coating composition, and therefore coating with a specific polysiloxane composition is effective.

Further, in a method as a conventional technique in which a photoresist pattern is filled with a polysiloxane composition, an organic film is present as an underlayer, and therefore a treatment, such as ashing, is difficult and gas etching is generally performed. By contrast, in the present invention, with respect to the pattern of the organic underlayer film immediately on a substrate to be processed or on an oxide film, a reversal of the pattern can be made using the polysiloxane composition, and therefore the pattern reversal can be easily achieved by an ashing treatment after filling the pattern with the polysiloxane composition and then curing the composition.

Particularly, in the present invention, by employing a specific polysiloxane material, complete planarization for the stepped surface can be made, making it possible to realize very flat planarization property of the coating film. As a result, a satisfactory film remains and a pattern reversal processing can be performed in that state. The term "planarization" means that, with respect to the coating film applied to a resist pattern, there is a small difference in the thickness of the applied coating film present above both a portion of the resist in which the pattern is present (line portion) and a portion of the resist in which the pattern is not present (space portion).

DESCRIPTION OF EMBODIMENTS

1. Stepped Substrate Planarization Composition

Hereinbelow, the stepped substrate planarization composition of the present invention will be described.

In step (3) in item [9] above, the stepped substrate planarization composition of the present invention (sometimes referred to as "coating polysiloxane composition") is applied to the resist pattern during or after the development. In this instance, a part of the silicon hard mask may remain on the upper surface of the organic underlayer film. The reason for this is that the stepped substrate planarization composition is etched back later so as to bare the upper surface of the organic underlayer film, and thus both the coating polysiloxane and the silicon hard mask can be removed by etchback at the same time.

The polysiloxane contains a silanol group in a proportion of 20 mol % or less relative to Si atom. The proportion of the silanol group can be 5 to 20 mol %, or 10 to 20 mol %.

The proportion of the silanol group in the polysiloxane can be determined by $^1$H NMR.

The polysiloxane has a weight average molecular weight of 1,000 to 50,000. A preferred weight average molecular weight ranges 1,200 to 20,000.

The polysiloxane generally comprises a hydrolysate condensation product of a hydrolyzable silane raw material. The hydrolyzable silane raw material may contain one or two or more species of silanes.

Preferably, the polysiloxane comprises a hydrolysate condensation product of a hydrolyzable silane raw material comprising a hydrolyzable silane represented by the following formula (1):

[Chemical formula 4]

Formula (1)

wherein $R^1$ is bonded to the silicon atom through a Si—C bonding and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group; $R^2$ represents an alkoxy group, an acyloxy group, or a halogen group; and a represents 1.

More preferably, the polysiloxane comprises a hydrolysate condensation product of a hydrolyzable silane raw material comprising 100 to 50 mol %, further preferably 95 to 50 mol % of the hydrolyzable silane represented by formula (1) above wherein a is 1, and 0 to 50 mol %, further preferably 5 to 50 mol % of the hydrolyzable silane represented by formula (1) above wherein a is 2.

Still more preferably, the hydrolyzable silane raw material comprises 95 to 70 mol % of the hydrolyzable silane of formula (1) wherein a is 1, and 5 to 30 mol % of the hydrolyzable silane of formula (1) wherein a is 2.

More preferably, the polysiloxane is a dehydration treatment product with an alcohol and an acid of a polysiloxane comprising a hydrolysate condensation product of a hydrolyzable silane raw material comprising 0 to 100 mol %, further preferably 1 to 100 mol % of the hydrolyzable silane of formula (1) above wherein a is 0, and 0 to 100 mol %, further preferably 0 to 99 mol % of the hydrolyzable silane of formula (1) above wherein a is 1.

More preferably, the polysiloxane is a treatment product with a non-alcohol and a base or a weak acid of a polysiloxane comprising a hydrolysate condensation product of the hydrolyzable silane raw material of formula (1) above wherein a is 1 or 2. Further preferably, the weak acid is an acid having an acid dissociation constant of 4 to 5.

For the above-mentioned polysiloxane (hydrolysate condensation product), the hydrolyzable silane raw material or the hydrolysate thereof may be used in the form of a mixture. There can be also used a mixture of the hydrolysate condensation product having mixed thereinto a partial hydrolysate that has not been completely hydrolyzed when obtaining the hydrolysate condensation product, or a silane compound. The condensation product is a polymer having a polysiloxane structure.

As the above-mentioned acid, an organic acid having an acid dissociation constant (pka) of −1 to 5, preferably 4 to 5 may be used. Examples of the acids include trifluoroacetic acid, maleic acid, benzoic acid, isobutyric acid, and acetic acid, especially include benzoic acid, isobutyric acid, and acetic acid.

Further, acids having a boiling point of 70 to 160° C. are preferred. Examples of such acids include trifluoroacetic acid, isobutyric acid, and acetic acid.

As the above-mentioned acid, preferred is an acid having either an acid dissociation constant (pka) of 4 to 5 or a boiling point of 70 to 160° C. That is, an acid having a weak acidity, or an acid having a strong acidity but having a low boiling point may be used.

For the acid, any of the properties of acid dissociation constant and boiling point can be utilized, but acetic acid having both of the properties may be preferably used.

As the polysiloxane, which is the raw material used in the present invention, there can be used a hydrolysate condensation product obtained by hydrolyzing at least one hydrolyzable silane raw material selected from the group consisting of formula (1) followed by condensing the resultant hydrolysate.

The organic pattern is more preferably a resist pattern. The organic pattern is more preferably a nanoimprinted pattern. The organic pattern is more preferably an organic underlayer film pattern (which is obtained by processing an organic underlayer film (of an application type or a deposition type) to be patterned). Of these, especially preferred is a resist pattern.

The stepped substrate planarization composition of the present invention comprises a solvent and a hydrolysate condensation product of a hydrolyzable silane represented by formula (1) above. Further, the stepped substrate planarization composition may comprise, as optional components, for example, an acid, water, an alcohol, a curing catalyst, an acid generator, another organic polymer, a light absorbing compound, and a surfactant. The solids content of the stepped substrate planarization composition of the present invention ranges, for example, 0.1 to 50% by mass, 0.1 to 30% by mass, 0.1 to 25% by mass, 0.5 to 20.0% by mass, or 1.0 to 10.0% by mass. The solids content refers to all components of the stepped substrate planarization composition except for the solvent component. The proportion of the hydrolyzable silane, hydrolysate thereof, and hydrolysate condensation product thereof in the solids is 20% by mass or more, for example, 50 to 100% by mass, 60 to 99% by mass, or 70 to 99% by mass. The concentration of the hydrolyzable silane, hydrolysate thereof, and hydrolysate condensation product thereof (polysiloxane) in the composition ranges 0.5 to 20.0% by mass.

In the present invention, the composition is a coating composition used after the exposure for the resist, and therefore the resist is subjected to exposure through a mask and the resist during or after the development is filled with the composition.

The hydrolyzable silane, hydrolysate thereof, and hydrolysate condensation product thereof have a resin component different from the resist.

Thus, in the subsequent dry etching step, by appropriately selecting the gas, the resist is selectively removed by dry etching, so that a new pattern is formed from the hydrolysate condensation product (polysiloxane) filling the resist.

The hydrolyzable silane, hydrolysate thereof, and hydrolysate condensation product thereof may be used in the form of a mixture thereof. The hydrolyzable silane is hydrolyzed, and a condensation product obtained by condensing the resultant hydrolysate can be used. There can also be used a mixture of the hydrolysate condensation product having mixed thereinto a partial hydrolysate that has not been completely hydrolyzed when obtaining the hydrolysate condensation product, or a silane compound. The condensation product is a polymer having a polysiloxane structure.

Typical examples of the alkyl groups include linear or branched alkyl groups having 1 to 10 carbon atoms, such as a methyl group, an ethyl group, a n-propyl group, an i-propyl group, a n-butyl group, an i-butyl group, a s-butyl group, a t-butyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a n-hexyl, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

Further, a cyclic alkyl group may also be used, and examples of such groups include cyclic alkyl groups having 1 to 10 carbon atoms, such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Typical examples of the above-mentioned alkenyl groups include alkenyl groups having 2 to 10 carbon atoms, such as an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Typical examples of the above-mentioned aryl groups include aryl groups having 6 to 20 carbon atoms, such as a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Typical examples of the above-mentioned organic groups having an epoxy group include glycidoxymethyl, glycidoxyethyl, glycidoxypropyl, glycidoxybutyl, and epoxycyclohexyl. Typical examples of the above-mentioned organic groups having an acryloyl group include acryloylmethyl, acryloylethyl, and acryloylpropyl. Typical examples of the above-mentioned organic groups having a methacryloyl group include methacryloylmethyl, methacryloylethyl, and methacryloylpropyl. Typical examples of the above-mentioned organic groups having a mercapto group include ethylmercapto, butylmercapto, hexylmercapto, and octylmercapto. Typical examples of the above-mentioned organic groups having a cyano group include cyanoethyl and cyanopropyl.

Typical examples of the above-mentioned alkoxy groups include alkoxy groups having a linear, branched, or cyclic alkyl portion having 1 to 20 carbon atoms, such as a methoxy group, an ethoxy group, a n-propoxy group, an i-propoxy group, a n-butoxy group, an i-butoxy group, a s-butoxy group, a t-butoxy group, a n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group, and cyclic alkoxy groups, such as a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-i-propyl-cyclopropoxy group, a 2-i-propyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

Typical examples of the above-mentioned acyloxy groups include the acyloxy groups having 2 to 20 carbon atoms, such as a methylcarbonyloxy group, an ethylcarbonyloxy group, a n-propylcarbonyloxy group, an i-propylcarbonyloxy group, a n-butylcarbonyloxy group, an i-butylcarbonyloxy group, a s-butylcarbonyloxy group, a t-butylcarbonyloxy group, a n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, a n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

Typical examples of the above-mentioned halogen groups include fluorine, chlorine, bromine, and iodine. The above-mentioned examples of groups can be applied to the portions of alkyl group, aryl group, alkoxy group, and halogen group in the haloalkyl group, haloaryl group, and alkoxyaryl group.

In formula (1), $R^1$ is preferably a methyl group or a phenyl group optionally substituted with a halogen group or an alkoxy group.

Further, in the present invention, the stepped substrate planarization composition comprising the hydrolysate condensation product of the hydrolyzable silane raw material, and a crosslinking compound having 2 to 6 methoxymethyl groups per molecule may be used. Examples of the crosslinking compounds having 2 to 6 methoxymethyl groups per molecule include melamine and substituted urea crosslinking compounds and polymers thereof. Preferred are crosslinking agents having a crosslinking formation substituent, and examples include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Further, condensation products of these compounds may be used. The amount of the crosslinking agent added varies depending on, for example, the coating solvent used, the substrate used, the required solution viscosity, or the required form of film, but ranges 0.001 to 80% by mass, preferably 0.01 to 50% by mass, further preferably 0.05 to 40% by mass, based on the mass of all solids.

In the present invention, as a catalyst for accelerating the above-mentioned crosslinking reaction, an acid compound, such as p-toluenesulfonic acid, trifluoromethanesulfonic acid, pyridinium p-toluenesulfonate, salicylic acid, sulfosalicylic acid, citric acid, benzoic acid, hydroxybenzoic acid, or naphthalenecarboxylic acid, or/and a thermal acid generator, such as 2,4,4,6-tetrabromocyclohexadienone, benzoin tosylate, 2-nitrobenzyl tosylate, or another organic sulfonic acid alkyl ester, may be incorporated. The amount of the catalyst incorporated ranges 0.0001 to 20% by mass, preferably 0.0005 to 10% by mass, preferably 0.01 to 3% by mass, based on the mass of all solids.

Specific examples of the hydrolysate condensation products (polysiloxanes) used in the present invention are shown below.

Formula (1-1)

Formula (1-2)

Formula (1-3)

Formula (1-4)

Formula (1-5)

Formula (1-6)

As the hydrolysate condensation product (polyorganosiloxane) of the hydrolyzable silane raw material, a condensation product having a weight average molecular weight of 1,000 to 50,000 can be obtained. The molecular weight is a molecular weight as measured by a GPC analysis in which polystyrene is used for molecular weight calibration. The GPC measurement may be carried out under the conditions using, for example, a GPC apparatus (trade name: HLC-8220GPC; manufactured by Tosoh Corp.) and a GPC column (trade name: Shodex KF803L, KF802, KF801 manufactured by Showa Denko K.K.); employing a column temperature of 40° C., tetrahydrofuran as an eluent (elution solvent), a flow rate of 1.0 ml/minute, and polystyrene (manufactured by Showa Denko K.K.) as a standard sample.

In hydrolysis of an alkoxysilyl group, an acyloxysilyl group, or a halosilyl group, 0.5 to 100 mol, preferably 1 to 10 mol of water is used per 1 mol of a hydrolyzable group. In hydrolysis, a hydrolysis catalyst may be used, but hydrolysis can be made without using a hydrolysis catalyst. When a hydrolysis catalyst is used, 0.001 to 10 mol, preferably 0.001 to 1 mol of the hydrolysis catalyst may be used per 1 mol of a hydrolyzable group. The reaction temperature for conducting hydrolysis and condensation generally ranges 20 to 110° C. The hydrolysis may be either complete hydrolysis or partial hydrolysis. That is, a hydrolysate or monomers may remain in the hydrolysate condensation product.

A catalyst may be used in the hydrolysis and condensation. As a hydrolysis catalyst, an acid or a base may be used. Further, examples of hydrolysis catalysts include metal chelate compounds, organic acids, inorganic acids, organic bases, and inorganic bases.

Examples of metal chelate compounds as a hydrolysis catalyst include titanium chelate compounds, such as tri-ethoxy-mono(acetylacetonato)titanium, tri-n-propoxy-mono(acetylacetonato)titanium, tri-i-propoxy-mono(acetylacetonato)titanium, tri-n-butoxy-mono(acetylacetonato)titanium, tri-sec-butoxy-mono(acetylacetonato)titanium, tri-t-butoxy-mono(acetylacetonato)titanium, diethoxy-bis(acetylacetonato)titanium, di-n-propoxy-bis(acetylacetonato)titanium, di-i-propoxy-bis(acetylacetonato)titanium, di-n-butoxy-bis(acetylacetonato)titanium, di-sec-butoxy-bis(acetylacetonato)titanium, di-t-butoxy-bis(acetyl acetonato)titanium, monoethoxy-tris(acetylacetonato)titanium, mono-n-propoxy-tris(acetylacetonato)titanium, mono-i-propoxy-tris(acetylacetonato)titanium, mono-n-butoxy-tris(acetylacetonato) titanium, mono-sec-butoxy-tris(acetyl acetonato)titanium, mono-t-butoxy-tris(acetylacetonato)titanium, tetrakis(acetylacetonato)titanium, triethoxy-mono(ethylacetoacetate)titanium, tri-n-propoxy-mono(ethylacetoacetate)titanium, tri-i-propoxy-mono(ethylacetoacetate)titanium, tri-n-butoxy-mono(ethylacetoacetate)titanium, tri-sec-butoxy-mono(ethylacetoacetate)titanium, tri-t-butoxy-mono(ethylacetoacetate)titanium, diethoxy-bis(ethylacetoacetate)titanium, di-n-propoxy-bis(ethylacetoacetate)titanium, di-i-propoxy-bis(ethyl acetoacetate)titanium, di-n-butoxy-bis(ethylacetoacetate)titanium, di-sec-butoxy-bis(ethylacetoacetate)titanium, di-t-butoxy-bis(ethylacetoacetate)titanium, monoethoxy-tris(ethylacetoacetate)titanium, mono-n-propoxy-tris(ethyl acetoacetate)titanium, mono-i-propoxy-tris(ethylacetoacetate)titanium, mono-n-butoxy-tris(ethylacetoacetate) titanium, mono-sec-butoxy-tris(ethyl acetoacetate)titanium, mono-t-butoxy-tris(ethylacetoacetate)titanium, tetrakis(ethylacetoacetate)titanium, mono(acetyl acetonato)tris (ethyl acetoacetate)titanium, bis(acetylacetonato)bis(ethylacetoacetate)titanium, and tris(acetyl acetonato)mono(ethyl acetoacetate)titanium; zirconium chelate compounds, such as triethoxy-mono(acetylacetonato)zirconium, tri-n-propoxy-mono(acetylacetonato)zirconium, tri-i-propoxy-mono(acetylacetonato)zirconium, tri-n-butoxy-mono(acetylacetonato)zirconium, tri-sec-butoxy-mono(acetylacetonato)zirconium, tri-t-butoxy-mono(acetylacetonato)zirconium, diethoxy-bis(acetylacetonato)zirconium, di-n-propoxy-bis(acetylacetonato)zirconium, di-i-propoxy-bis(acetylacetonato)zirconium, di-n-butoxy-bis(acetylacetonato)zirconium, di-sec-butoxy-bis(acetylacetonato)zirconium, di-t-butoxy-bis(acetylacetonato)zirconium, monoethoxy-tris(acetylacetonato)zirconium, mono-n-propoxy-tris(acetylacetonato)zirconium, mono-i-propoxy-tris(acetylacetonato)zirconium, mono-n-butoxy-tris(acetylacetonato) zirconium, mono-sec-butoxy-tris(acetylacetonato)zirconium, mono-t-butoxy-tris(acetylacetonato)zirconium, tetrakis(acetylacetonato)zirconium, triethoxy-mono(ethylacetoacetate)zirconium, tri-n-propoxy-mono(ethylacetoacetate) zirconium, tri-i-propoxy-mono(ethylacetoacetate)zirconium, tri-n-butoxy-mono(ethylacetoacetate)zirconium, tri-sec-butoxy-mono(ethylacetoacetate)zirconium, tri-t-butoxy-mono(ethylacetoacetate)zirconium, diethoxy-bis(ethylacetoacetate)zirconium, di-n-propoxy-bis(ethylacetoacetate)

zirconium, di-i-propoxy-bis(ethylacetoacetate)zirconium, di-n-butoxy-bis(ethylacetoacetate)zirconium, di-sec-butoxy-bis(ethylacetoacetate)zirconium, di-t-butoxy-bis(ethylacetoacetate)zirconium, monoethoxy-tris(ethylacetoacetate)zirconium, mono-n-propoxy-tris(ethylacetoacetate)zirconium, mono-i-propoxy-tris(ethylacetoacetate)zirconium, mono-n-butoxy-tris(ethylacetoacetate)zirconium, mono-sec-butoxy-tris(ethylacetoacetate)zirconium, mono-t-butoxy-tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium, and tris(acetylacetonato)mono(ethylacetoacetate)zirconium; and aluminum chelate compounds, such as tris(acetylacetonato)aluminum and tris(ethylacetoacetate)aluminum.

Examples of organic acids as a hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of inorganic acids as a hydrolysis catalyst include hydrochloric acid, nitric acid, sulfuric acid, hydrofluoric acid, and phosphoric acid.

Examples of organic bases as a hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of inorganic bases include ammonia, sodium hydroxide, potassium hydroxide, barium hydroxide, and calcium hydroxide. Of these catalysts, preferred are metal chelate compounds, organic acids, and inorganic acids, and these may be used alone or in combination.

Examples of organic solvents used in the hydrolysis include aliphatic hydrocarbon solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents, such as benzene, toluene, xylene, ethylbenzene, trimethylbenzene, methylethylbenzene, n-propylbenzene, propylbenzene, diethylbenzene, i-butylbenzene, triethylbenzene, di-i-propylbenzene, n-amylnaphthalene, and trimethylbenzene; monoalcohol solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol; ketone solvents, such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propane sultone. These solvents can be used alone or in combination.

Particularly, preferred are ketone solvents, such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone, from the viewpoint of the storage stability of the resultant solution.

2. Other Components

Other components that may be contained in the stepped substrate planarization composition are described below.

The stepped substrate planarization composition of the present invention may contain a curing catalyst. The curing catalyst serves as a curing catalyst when heating a coating film containing a polyorganosiloxane comprising a hydrolysate condensation product to cure it. As the curing catalyst, an ammonium salt, a phosphine, a phosphonium salt, or a sulfonium salt may be used.

The ammonium salt includes a quaternary ammonium salt having a structure represented by the following formula (D-1):

[Chemical formula 6]

Formula (D-1)

wherein m represents an integer of 2 to 11, n represents an integer of 2 or 3, $R^{21}$ represents an alkyl group or an aryl group, and $Y^-$ represents an anion, a quaternary ammonium salt having a structure represented by the following formula (D-2):

[Chemical formula 7]

Formula (D-2)

wherein $R^{22}$, $R^{23}$, $R^{24}$ and $R^{25}$ represent an alkyl group or an aryl group, N represents a nitrogen atom, and $Y^-$ represents an anion, wherein $R^{22}$, $R^{23}$, $R^{24}$, and $R^{25}$ are bonded to the nitrogen atom through a C—N bonding, respectively, a quaternary ammonium salt having a structure represented by the following formula (D-3):

[Chemical Formula 8]

Formula (D-3)

wherein $R^{26}$ and $R^{27}$ represent an alkyl group or an aryl group, and $Y^-$ represents an anion, a quaternary ammonium salt having a structure represented by the following formula (D-4):

[Chemical Formula 9]

Formula (D-4)

wherein $R^{28}$ represents an alkyl group or an aryl group, and $Y^-$ represents an anion, a quaternary ammonium salt having a structure represented by the following formula (D-5):

[Chemical Formula 10]

Formula (D-5)

wherein $R^{29}$ and $R^{30}$ represent an alkyl group or an aryl group, and $Y^-$ represents an anion, and a tertiary ammonium salt having a structure represented by the following formula (D-6):

[Chemical formula 11]

Formula (D-6)

wherein m represents an integer of 2 to 11, n represents an integer of 2 or 3, H represents a hydrogen atom, and $Y^-$ represents an anion.

The phosphonium salt includes a quaternary phosphonium salt represented by the following formula (D-7):

[Chemical formula 12]

Formula (D-7)

wherein $R^{31}$, $R^{32}$, $R^{33}$ and $R^{34}$ represent an alkyl group or an aryl group, P represents a phosphorus atom, and $Y^-$ represents an anion, wherein $R^{31}$, $R^{32}$, $R^{33}$, and $R^{34}$ are bonded to the phosphorus atom through a C—P bonding, respectively.

The sulfonium salt includes a tertiary sulfonium salt represented by the following formula (D-8):

[Chemical formula 13]

Formula (D-8)

wherein $R^{35}$, $R^{36}$, and $R^{37}$ represent an alkyl group or an aryl group, S represents a sulfur atom, and $Y^-$ represents an anion, wherein $R^{35}$, $R^{36}$, and $R^{37}$ are bonded to the sulfur atom through a C—S bonding, respectively.

The compound of formula (D-1) above is a quaternary ammonium salt derived from an amine, and m represents an integer of 2 to 11, and n represents an integer of 2 or 3. In the quaternary ammonium salt, $R^{21}$ represents an alkyl group having 1 to 18 carbon atoms or an aryl group, preferably having 2 to 10 carbon atoms, and examples include linear alkyl groups, such as an ethyl group, a propyl group, and a butyl group, and a benzyl group, a cyclohexyl group, a cyclohexylmethyl group, and a dicyclopentadienyl group. Examples of anion ($Y^-$) include halogen ions, such as a chloride ion ($Cl^-$), a bromide ion ($Br^-$), and an iodide ion ($I^-$), and acid groups, such as carboxylate (—COO$^-$), sulfonato (—SO$_3^-$), and alcoholate (—O$^-$).

The compound of formula (D-2) above is a quaternary ammonium salt represented by $R^{22}R^{23}R^{24}R^{25}N^+Y^-$. In the quaternary ammonium salt, $R^{22}$, $R^{23}$, $R^{24}$, and $R^{25}$ are an alkyl group having 1 to 18 carbon atoms or an aryl group, or a silane compound bonded to a silicon atom through a Si—C bonding. Examples of anion ($Y^-$) include halogen ions, such as a chloride ion (Cl⁻), a bromide ion (Br⁻), and an iodide ion (I⁻), and acid groups, such as carboxylate (—COO⁻), sulfonato (—$SO_3^-$), and alcoholate (—O⁻). This quaternary ammonium salt is commercially available, and examples of such commercially available quaternary ammonium salts include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of formula (D-3) above is a quaternary ammonium salt derived from a 1-substituted imidazole, and $R^{26}$ and $R^{27}$ are an alkyl group having 1 to 18 carbon atoms or an aryl group, and the total number of carbon atoms of $R^{26}$ and $R^{27}$ is preferably 7 or more. For example, examples of $R^{26}$ include a methyl group, an ethyl group, a propyl group, a phenyl group, and a benzyl group, and examples of $R^{27}$ include a benzyl group, an octyl group, and an octadecyl group. Examples of anion (Y⁻) include halogen ions, such as a chloride ion (Cl⁻), a bromide ion (Br⁻), and an iodide ion (I⁻), and acid groups, such as carboxylate (—COO⁻), sulfonato (—$SO_3^-$), and alcoholate (—O⁻). This compound is commercially available, but can be produced by reacting, for example, an imidazole compound, such as 1-methylimidazole or 1-benzylimidazole, and an alkyl halide or an aryl halide, such as benzyl bromide or methyl bromide.

The compound of formula (D-4) above is a quaternary ammonium salt derived from pyridine, and $R^{28}$ represents an alkyl group having 1 to 18 carbon atoms, preferably having 4 to 18 carbon atoms or an aryl group, and examples include a butyl group, an octyl group, a benzyl group, and a lauryl group. Examples of anion (Y⁻) include halogen ions, such as a chloride ion (Cl⁻), a bromide ion (Br⁻), and an iodide ion (I⁻), and acid groups, such as carboxylate (—COO⁻), sulfonato (—$SO_3^-$), and alcoholate (—O⁻). This compound is commercially available, but can be produced by reacting, for example, pyridine and an alkyl halide or an aryl halide, such as lauryl chloride, benzyl chloride, benzyl bromide, methyl bromide, or octyl bromide. Examples of the compounds include N-laurylpyridinium chloride and N-benzylpyridinium bromide.

The compound of formula (D-5) above is a quaternary ammonium salt derived from a substituted pyridine, such as picoline, and $R^{29}$ is an alkyl group having 1 to 18 carbon atoms, preferably having 4 to 18 carbon atom or an aryl groups, and examples include a methyl group, an octyl group, a lauryl group, and a benzyl group. $R^{30}$ is an alkyl group having 1 to 18 carbon atoms or an aryl group, and, for example, when the compound is a quaternary ammonium derived from picoline, $R^{30}$ is a methyl group. Examples of anion (Y⁻) include halogen ions, such as a chloride ion (Cl⁻), a bromide ion (Br⁻), and an iodide ion (I⁻), and acid groups, such as carboxylate (—COO⁻), sulfonato (—$SO_3^-$), and alcoholate (—O⁻). This compound is commercially available, but can be produced by reacting, for example, a substituted pyridine, such as picoline, and an alkyl halide or an aryl halide, such as methyl bromide, octyl bromide, lauryl chloride, benzyl chloride, or benzyl bromide. Examples of the compounds include N-benzylpicolinium chloride, N-benzylpicolinium bromide, and N-laurylpicolinium chloride.

The compound of formula (D-6) above is a tertiary ammonium salt derived from an amine, and m represents an integer of 2 to 11, and n represents an integer of 2 or 3. Examples of anion (Y⁻) include halogen ions, such as a chloride ion (Cl⁻), a bromide ion (Br⁻), and an iodide ion (I⁻), and acid groups, such as carboxylate (—COO⁻), sulfonato (—$SO_3^-$), and alcoholate (—O⁻). The compound can be produced by reacting an amine and a weak acid, such as a carboxylic acid or phenol. Examples of carboxylic acids include formic acid and acetic acid, and, when formic acid is used, an anion (Y⁻) is (HCOO⁻), and, when acetic acid is used, an anion (Y) is ($CH_3COO^-$). When phenol is used, an anion (Y) is ($C_6H_5O$).

The compound of formula (D-7) above is a quaternary phosphonium salt having a structure of $R^{31}R^{32}R^{33}R^{34}P^+Y^-$. $R^{31}$, $R^{32}$, $R^{33}$, and $R^{34}$ are an alkyl group having 1 to 18 carbon atoms or an aryl group, or a silane compound bonded to a silicon atom through a Si—C bonding, and it is preferred that three of the four substituents $R^{31}$ to $R^{34}$ are a phenyl group or a substituted phenyl group, for example, a phenyl group or a tolyl group, and the remaining one substituent is an alkyl group having 1 to 18 carbon atoms, an aryl group, or a silane compound bonded to a silicon atom through a Si—C bonding. Examples of anion (Y⁻) include halogen ions, such as a chloride ion (Cl⁻), a bromide ion (Br⁻), and an iodide ion (I⁻), and acid groups, such as carboxylate (—COO⁻), sulfonato (—$SO_3^-$), and alcoholate (—O⁻). This compound is commercially available, and examples of such commercially available compounds include tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; and triphenylbenzylphosphonium halides, tetraphenylphosphonium halides, tritolylmonoarylphosphonium halides, and tritolylmonoalkylphosphonium halides (wherein the halogen atom is a chlorine atom or a bromine atom). Particularly, preferred are triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (wherein the halogen atom is a chlorine atom or a bromine atom).

Examples of phosphines include primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of formula (D-8) above is a tertiary sulfonium salt having a structure of $R^{35}R^{36}R^{37}S^+Y^-$. $R^{35}$, $R^{36}$, and $R^{37}$ are an alkyl group having 1 to 18 carbon atoms or an aryl group, or a silane compound bonded to a silicon atom through a Si—C bonding, and it is preferred that three of the four substituents $R^{35}$ to $R^{37}$ are a phenyl group or a substituted phenyl group, for example, a phenyl group or a tolyl group, and the remaining one substituent is an alkyl group having 1 to 18 carbon atoms or an aryl group. Examples of anion (Y⁻) include halogen ions, such as a chloride ion (Cl⁻), a bromide ion (Br⁻), and an iodide ion (I⁻), and acid groups, such as carboxylate (—COO⁻), sulfonato (—$SO_3^-$), alcoholate (—O⁻), a maleic acid anion, and a nitric acid anion. This compound is commercially available, and examples of such commercially available compounds include tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; triphenylsulfonium halides (wherein the halogen atom is a chlorine atom or a bromine atom); tetraalkylphosphonium carboxylates, such as tri-n-butylsulfonium carboxylates and tri-n-propylsulfonium carboxylates; trialkylbenzylsulfonium carboxylates, such as diethylbenzylsulfonium carboxylates; diphenylmonoalkylsulfonium carboxylates, such as diphenylmethylsulfonium carboxylates and diphenylethylsulfonium carboxylates; and triphenylsulfonium carboxylates. Triphenylsulfonium halides and triphenylsulfonium carboxylates can be preferably used.

Further, in the present invention, a nitrogen-containing silane compound may be added as a curing catalyst. Examples of nitrogen-containing silane compounds include imidazole ring-containing silane compounds, such as N-(3-triethoxysilylpropyl)-4,5-dihydroimidazole. The amount of the curing catalyst ranges 0.01 to 10 parts by mass, or 0.01 to 5 parts by mass, or 0.01 to 3 parts by mass, relative to 100 parts by mass of the polyorganosiloxane.

As the curing catalyst, the nitrogen-containing silane compound is especially preferred.

The hydrolyzable silane is hydrolyzed in a solvent using a catalyst and condensed, and, from the obtained hydrolysate condensation product (polymer), an alcohol which is a by-product and the hydrolysis catalyst used and water can be removed at the same time by, for example, vacuum distillation. Further, the acid or basic catalyst used in the hydrolysis can be removed by neutralization or ion-exchange. In the stepped substrate planarization composition of the present invention, for stabilizing the stepped substrate planarization composition containing the hydrolysate condensation product, an organic acid, water, an alcohol, or a combination thereof may be added.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Of these, for example, oxalic acid and maleic acid are preferred. The amount of the organic acid added ranges 0.1 to 5.0 parts by mass, relative to 100 parts by mass of the condensation product (polyorganosiloxane). As the water to be added, for example, pure water, ultrapure water, or ion-exchanged water may be used, and the amount of the water added may range 1 to 20 parts by mass, relative to 100 parts by mass of the stepped substrate planarization composition. It is preferred that the alcohol to be added is easily evaporated by heating after its application, and the examples thereof include methanol, ethanol, propanol, isopropanol, and butanol. The amount of the alcohol added may range 1 to 20 parts by mass, relative to 100 parts by mass of the composition for forming a resist underlayer film.

Accordingly, the stepped substrate planarization composition may contain at least one member selected from the group consisting of water, an acid, and a curing catalyst. In addition to the above-mentioned components, the stepped substrate planarization composition of the present invention may contain, if necessary, for example, an organic polymer compound, a photo-acid generator, and a surfactant.

By using an organic polymer compound, it is possible to control, for example, the dry etching rate (reduction of the film thickness per unit time) for and the attenuation coefficient and refractive index of the resist underlayer film formed from the stepped substrate planarization composition of the present invention.

Examples of photo-acid generators contained in the stepped substrate planarization composition of the present invention include onium salt compounds, sulfonimide compounds, and disulfonyldiazomethane compounds. Examples of onium salt compounds include iodonium salt compounds, such as diphenyliodonium hexafluorophosphate, diphenyliodonium trifluoromethanesulfonate, diphenyliodonium nonafluoronormalbutanesulfonate, diphenyliodonium perfluoronormaloctanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoronormalbutanesulfonate, triphenylsulfonium camphorsulfonate, and triphenylsulfonium trifluoromethanesulfonate.

Examples of sulfonimide compounds include N-(trifluoromethanesulfonyloxy)succinimide, N-(nonafluoronormalbutanesulfonyloxy)succinimide, N-(camphorsulfonyloxy)succinimide, and N-(trifluoromethanesulfonyloxy)naphthalimide.

Examples of disulfonyldiazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photo-acid generator may be used alone or in combination. When a photo-acid generator is used, the amount of the photo-acid generator ranges 0.01 to 15 parts by mass, or 0.1 to 10 parts by mass, or 0.5 to 1 part by mass, relative to 100 parts by mass of the condensation product (polyorganosiloxane).

When applying the stepped substrate planarization composition of the present invention to a substrate, a surfactant is effective in suppressing, for example, the occurrence of pinholes and striation. Examples of surfactants contained in the stepped substrate planarization composition of the present invention include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether; polyoxyethylene alkylaryl ethers, such as polyoxyethylene octylphenol ether and polyoxyethylene nonylphenol ether; polyoxyethylene/polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorine surfactants, such as trade name: EFTOP EF301, EF303, EF352 (manufactured by Tohchem Products Co., Ltd.), trade name: MEGAFACE F171, F173, R-08, R-30, R-30N, R-40LM (manufactured by DIC Corporation), Fluorad FC430, FC431 (manufactured by Sumitomo 3M), and trade names: AsahiGuard AG710, Surflon S-382, SC101, SC102, SC103, SC104, SC105, SC106 (manufactured by Asahi Glass Co., Ltd.), and organosiloxane polymer KP341 (manufactured by Shin-Etsu Chemical Co., Ltd.). These surfactants may be used alone or in combination. When a surfactant is used, the amount of the surfactant ranges 0.0001 to 5 parts by mass, or 0.001 to 1 part by mass, or 0.01 to 1 part by mass, relative to 100 parts by mass of the condensation product (polyorganosiloxane).

Further, in the stepped substrate planarization composition of the present invention, for example, a rheology modifier and a bonding assistant may be added. A rheology modifier is effective in improving the fluidity of the composition for forming an underlayer film. A bonding assistant is effective in improving the adhesion of the underlayer film to the semiconductor substrate or resist.

As the solvent used in the stepped substrate planarization composition of the present invention, there is no particular limitation and any solvent can be used as long as it is capable of dissolving the above-mentioned solids. Examples of such solvents include methyl cellosolve acetate, ethyl cellosolve acetate, propylene glycol, propylene glycol monomethyl ether, propylene glycol monoethyl ether, methylisobutylcarbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methyl acetamide, N,N-dimethylacetamide, N-methylpyrrolidone, 4-methyl-2-pentanol, and γ-butyrolactone. These solvents can be used alone or in combination.

3. Planarization Method for a Semiconductor Substrate

An example of the method for producing a semiconductor device of the present invention comprising a planarization method for a semiconductor substrate is described below. Further, the method is diagrammatically shown in FIG. 5.

The stepped substrate in the present invention includes, for example, wafers for a MEMS device. For example, it includes (1b) a silicon wafer having steps on one of the major surface, the steps being formed by a Bosch process or an alkaline aqueous solution; (2b) an SOI (Silicon on Insulator) wafer having a silicon oxide film present between a silicon wafer and another silicon wafer and having steps on one of the major surface; (3b) a gallium-arsenic substrate having a step form on one of the major surface; and (4b) a silicon wafer having a metal or insulating film formed thereon and having a step form on one of the major surface.

The method for producing a semiconductor device of the present invention comprising a planarization method for a semiconductor substrate is a method for producing a semiconductor device, which comprises the steps of: (1) forming an organic pattern on a substrate, (3) applying the composition according to any one of claims 1 to 7 to the organic pattern, and (4) etching the organic pattern to remove it so that a reverse pattern remains.

The organic pattern is a photoresist pattern, a resist underlayer (application type or deposition type) film pattern which functions as an etching mask for the underlying semiconductor substrate, or a pattern formed by nanoimprinting.

An example of the method for producing a semiconductor device of the present invention comprising a planarization method for a semiconductor substrate is a method for producing a semiconductor device, which comprises the steps of: (1a) applying a resist onto a substrate, (2) subjecting the resist to exposure and development, (3a) applying the coating polysiloxane composition of the present invention to the resist pattern during or after the development, and (4a) etching the resist pattern to remove it so that a reverse pattern remains.

Figure 5:
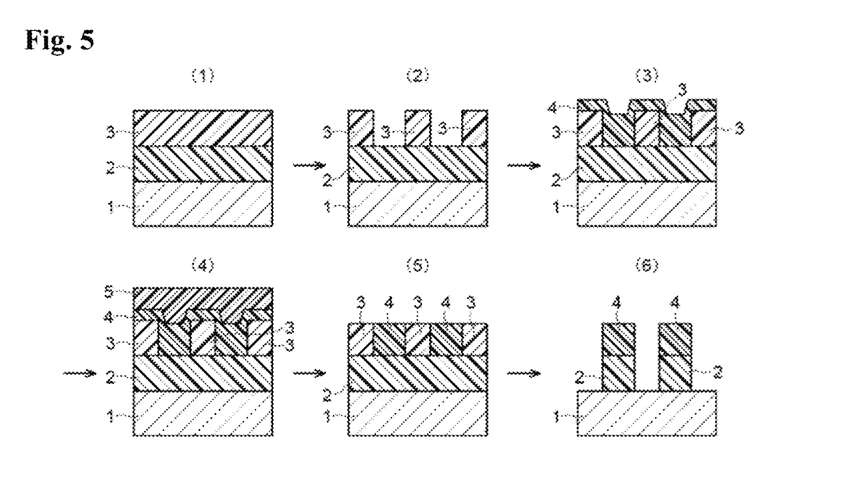
FIG. 5 Explanatory views illustrating one example of an application method using the stepped substrate planarization composition of the present invention.
Figure 6:
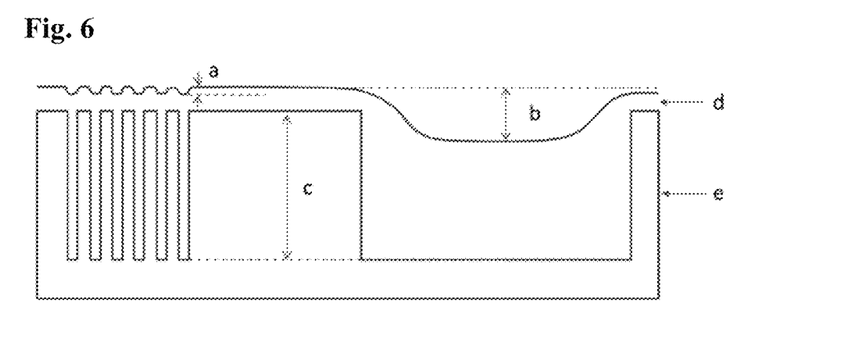
FIG. 6 An explanatory view illustrating one example of an application method using the coating polysiloxane composition of the present invention.

[Step (1) (FIG. 5(1))]

As the photoresist used in step (1a), there is no particular limitation as long as it is sensitive to a light used in the exposure. Any of a negative photoresist and a positive photoresist can be used. There are, for example, a positive photoresist comprising a novolak resin and 1,2-naphthoquinonediazidosulfonate; a chemical amplification photoresist comprising a binder having a group that is decomposable by an acid to increase the alkali solubility and a photo-acid generator; a chemical amplification photoresist comprising a low-molecular weight compound that is decomposable by an acid to increase the alkali solubility of the photoresist, an alkali-soluble binder, and a photo-acid generator, and a chemical amplification photoresist comprising a binder having a group that is decomposable by an acid to increase the alkali solubility, a low-molecular weight compound that is decomposable by an acid to increase the alkali solubility of the photoresist, and a photo-acid generator. For example, they include trade name: APEX-E, manufactured by Shipley Company, Inc.; trade name: PAR710, manufactured by Sumitomo Chemical Co., Ltd.; and trade name: SEPR430, manufactured by Shin-Etsu Chemical Co., Ltd. Further, they include fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000).

Any of a negative electron beam resist and a positive electron beam resist can be used. There are, for example, a chemical amplification resist comprising an acid generator and a binder having a group that is decomposable by an acid to change the alkali solubility; a chemical amplification resist comprising an alkali-soluble binder, an acid generator, and a low-molecular weight compound that is decomposable by an acid to change the alkali solubility of the resist; a chemical amplification resist comprising an acid generator, a binder having a group that is decomposable by an acid to change the alkali solubility, and a low-molecular weight compound that is decomposable by an acid to change the alkali solubility of the resist; a non-chemical amplification resist comprising a binder having a group that is decomposable by an electron beam to change the alkali solubility; and a non-chemical amplification resist comprising a binder having a site that is broken by an electron beam to change the alkali solubility. When these electron beam resists are used, a resist pattern can be formed in the same manner as in the case using a photoresist using an electron beam as an irradiation source.

The resist solution is applied and then baked at a baking temperature of 70 to 150° C. for a baking time of 0.5 to 5 minutes, and the resultant resist film has a thickness within the range of from 10 to 1,000 nm. The resist solution or developer, or the below-mentioned coating material can be applied by, for example, spin coating, a dipping method, or a spraying method, but especially preferred is a spin coating method. In exposure for the resist, the exposure is conducted through a predetermined mask. In the exposure, for example, a KrF excimer laser (wavelength: 248 nm), an ArF excimer laser (wavelength: 193 nm), an EUV light (wavelength: 13.5 nm), or an electron beam may be used. After the exposure, if necessary, a post exposure bake (PEB) may be performed. The post exposure bake is performed under conditions appropriately selected from those at a baking temperature of 70 to 150° C. for a baking time of 0.3 to 10 minutes.

Before step (1) or (1a), the method may comprise step (1a-1) of forming a resist underlayer film on a substrate. The resist underlayer film has an anti-reflection or organic hard mask function. A resist is formed in step (1a), and step (1a) can be performed in which a resist underlayer film is formed on a semiconductor substrate and a resist is formed thereon. Further, in step (1a-1), a resist underlayer film is formed on a semiconductor substrate and a silicon hard mask is formed thereon, and a resist can be formed on the mask. The resist underlayer film used in step (1a-1) prevents irregular reflection during the exposure for the upper layer resist, and is used for the purpose of improving the adhesion to the resist, and, for example, an acrylic resin or a novolak resin may be used. As the resist underlayer film, a film having a thickness of 1 to 1,000 nm can be formed on the semiconductor substrate. Further, the resist underlayer film used in step (1a-1) is a hard mask using an organic resin, and a material having a high carbon content and a low hydrogen content is used. Examples of such materials include a polyvinylnaphthalene resin, a carbazole novolak resin, a phenolic novolak resin, and a naphthol novolak resin. From these resins, a film having a thickness of 5 to 1,000 nm can be formed on the semiconductor substrate. As the silicon hard mask used in step (1a-1), a polysiloxane obtained by hydrolyzing a hydrolyzable silane can be used. For example, the polysiloxane includes those obtained by hydrolyzing tetraethoxysilane, methyltrimethoxysilane, or phenyltriethoxysilane. From these polysiloxanes, a film having a thickness of 5 to 200 nm can be formed on the resist underlayer film.

[Step (2) (FIG. 5(2))]

In step (2), exposure through a predetermined mask is conducted. In the exposure, for example, a KrF excimer laser (wavelength: 248 nm), an ArF excimer laser (wavelength: 193 nm), or an EUV light (wavelength: 13.5 nm) can be used. After the exposure, if necessary, a post exposure bake may be performed. The post exposure bake is performed under conditions appropriately selected from those at a baking temperature of 70 to 150° C. for a baking time of 0.3 to 10 minutes. Then, development using a developer is conducted. Thus, for example, when a positive photoresist is used, the exposed portion of the photoresist is removed, so that a pattern of the photoresist is formed.

Examples of developers include alkaline aqueous solutions, e.g., an aqueous solution of an alkali metal hydroxide, such as potassium hydroxide or sodium hydroxide, an aqueous solution of a quaternary ammonium hydroxide, such as tetramethylammonium hydroxide, tetraethylammonium hydroxide, or choline, and an aqueous solution of an amine, such as ethanolamine, propylamine, or ethylenediamine. Further, for example, a surfactant may be added to the developer. Conditions for development are appropriately selected from those at a temperature of 5 to 50° C. for a time of 10 to 600 seconds. Further, in the present invention, an organic solvent may be used as a developer. After the exposure, development using a developer (solvent) is performed. Thus, for example, when a positive photoresist is used, the unexposed portion of the photoresist is removed, so that a pattern of the photoresist is formed.

Examples of developers include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Further, for example, a surfactant may be added to the developer. Conditions for development are appropriately selected from those at a temperature of 5 to 50° C. for a time of 10 to 600 seconds.

[Step (3) (FIGS. 5(3) and 5(4))]

In step (3), the stepped substrate planarization composition of the present invention is applied to the resist during or after the development and baked to form a polysiloxane coating film, to form a polysiloxane composition film having a pattern of the resist filled with the composition. The stepped substrate planarization composition applied is baked at a baking temperature of 50 to 180° C. for 0.5 to 5 minutes. The polysiloxane coating film has an iso-dense bias of 50 nm or less. The iso-dense bias of the polysiloxane coating film refers to the difference between the smallest thickness and the largest thickness of the film, in which the thickness means the length from the interface of the stepped substrate on the side in contact with the film to the interface of the second polysiloxane coating film on the side in contact with the air. Specifically, the length of character b shown below corresponds to the iso-dense bias. In the figure, character a designates a depth of the depression in the polysiloxane coating film at the center of the dense space portion, character b designates a depth of the depression in the polysiloxane coating film at the center of the open space portion, character c designates a depth of the original space in the stepped substrate used, character d designates a polysiloxane coating film, and character e designates a stepped substrate. The stepped substrate can be an organic pattern (e.g., a photoresist pattern, a resist underlayer (application type or deposition type) film pattern which functions as an etching mask for the underlying semiconductor substrate, or a pattern formed by nanoimprinting) substrate.

Further, in this step, a polysiloxane composition film having a pattern of the resist filled with the composition can be formed by applying a first coating polysiloxane composition containing a first coating polysiloxane and baking it to form a first polysiloxane coating film, and applying onto the first polysiloxane coating film a second coating polysiloxane composition containing a second coating polysiloxane different from the first coating polysiloxane and baking it to form a second polysiloxane coating film. FIGS. 5(3) and 5(4) show this mode of the step. In this case, the second coating polysiloxane composition is at least the stepped substrate planarization composition of the present invention, but, as the first coating polysiloxane composition, any known polysiloxane composition may be appropriately selected and used. The applied coating polysiloxane composition is baked at a baking temperature of 50 to 180° C. for 0.5 to 5 minutes. The second polysiloxane coating film has an iso-dense bias of 50 nm or less.

In the present invention, after step (3), the method may comprise step (3-1) of etching back a surface of the coating film so as to bare a surface of the organic pattern (for example, a resist pattern). By performing this step, in the subsequent step (4), the surface of the resist pattern is consistent with the surface of the coating composition, and, due to the difference of gas etching rate of the resist pattern and that of the coating composition, only the resist component is removed, so that the component of the coating composition remains, to achieve a reversal of pattern. In the etchback, the resist pattern is bared using a gas (for example, a fluorine etching gas) which can remove the coating composition.

[Step (4) (FIGS. 5(5) and 5(6))]

In step (4), the resist pattern is removed by etching so that a reverse pattern remains. In step (4), dry etching is conducted using a gas, such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, or chlorine trifluoride. Dry etching is especially preferably conducted using an oxygen etching gas.

Thus, the original resist pattern is removed, so that a reverse pattern is formed from the polymer for forming a reverse pattern (polysiloxane obtained by hydrolyzing and condensing the hydrolyzable silane) contained in the coating composition.

EXAMPLES

Hereinbelow, the present invention will be described in detail with reference to the following Examples, which should not be construed as limiting the scope of the present invention.

Synthesis Example A1

30.0 g (80 mol %) of vinyltrimethoxysilane, 7.5 g (20 mol %) of dimethyldiethoxysilane, and 56 g of propylene glycol monomethyl ether acetate were placed in a 300 ml flask, and, while stirring the resultant mixture in the flask by means of a magnetic stirrer, 16.4 g of 0.01 mol/L acetic acid was dropwise added to the mixture. After the dropwise addition, the flask was transferred into an oil bath adjusted to 95° C., and a reaction was conducted for 24 hours. Then, the resultant reaction solution was cooled to room temperature, and 19 g of propylene glycol monomethyl ether acetate was added to the reaction solution, and acetone, water, and acetic acid as well as ethanol, which is a by-product of the reaction, were distilled off from the reaction solution under a reduced pressure to concentrate the solution, to obtain a propylene glycol monomethyl ether acetate solution of a cohydrolysate condensation product (polymer). The solids content of the obtained solution was adjusted to 30% by mass in terms of the solid residue content at 140° C.

15 g of the prepared polymer solution was transferred to a 100 ml flask, and subjected to reaction in an oil bath adjusted to 100° C. for 12 hours. The polymer had a weight average molecular weight Mw of 10,000 as measured by GPC in which polystyrene was used for molecular weight calibration.

<Synthesis Example A2>

17.0 g of a 35% by mass aqueous solution of tetraethylammonium hydroxide, 27.4 g of 2-propanol, and 54.8 g of tetrahydrofuran were placed in a 200 ml eggplant-shaped flask, and, while stirring the resultant mixture in the flask by means of a magnetic stirrer, 9.0 g (30 mol %) of vinyltrimethoxysilane and 25.3 g (70 mol %) of methyltriethoxysilane were dropwise added to the mixture. After the dropwise addition, the flask was transferred into an oil bath adjusted to 85° C., and a reaction was conducted for 4 hours while heating under reflux. Then, the resultant reaction solution was cooled to room temperature and transferred to a 500 ml separatory funnel. 100 g of ethyl acetate, 34 g of 6 N hydrochloric acid, and 68 g of ultrapure water were added to the separatory funnel, and an operation for separation was performed to obtain an ethyl acetate layer. 68 g of ultrapure water was added to the obtained ethyl acetate layer, and washing was performed. An operation for washing was repeated once more, and the resultant ethyl acetate layer was evaporated under a reduced pressure using an evaporator. The solids content of the obtained ethyl acetate solution of the hydrolysate condensation product (polymer) was adjusted to 20% by mass in terms of the solid residue content at 140° C. The polymer had a weight average molecular weight Mw of 4,000 as measured by GPC in which polystyrene was used for molecular weight calibration.

Comparative Synthesis Example A1

53.9 g (50 mol %) of tetraethoxysilane, 46.1 g (50 mol %) of methyltriethoxysilane, and 100 g of acetone were placed in a 500 ml flask, and, while stirring the resultant mixture in the flask by means of a magnetic stirrer, 32.6 g of 0.01 mol/L hydrochloric acid was dropwise added to the mixture. After the dropwise addition, the flask was transferred into an oil bath adjusted to 85° C., and a reaction was conducted for 4 hours while heating under reflux. Then, the resultant reaction solution was cooled to room temperature, and 100 g of 4-methyl-2-pentanol was added to the reaction solution, and acetone, water, and hydrochloric acid as well as ethanol, which is a by-product of the reaction, were distilled off from the reaction solution under a reduced pressure to concentrate the solution, to obtain a 4-methyl-2-pentanol solution of a cohydrolysate condensation product (polymer). The solids content of the obtained solution was adjusted to 13% by mass in terms of the solid residue content at 140° C. The polymer had a weight average molecular weight Mw of 1,400 as measured by GPC in which polystyrene was used for molecular weight calibration.

[Determination of Silanol Amount]

The silanol group ratio in the polymer was determined by $^1$H NMR. The measurement was conducted using JNM-ECA500 (manufactured by JEOL LTD.). The area of a chemical shift (0.0 to 0.6 ppm) of methyl protons of triethoxymethylsilane or dimethyldiethoxysilane was first measured, and, when it was taken as a reference, a silanol group was detected at 5 to 7 ppm as a broad peak. A silanol group ratio (mol %) relative to one Si atom in the polymer was determined by comparing the area at 5 to 7 ppm.

In some of the polymers, a chemical shift assigned to a silane monomer structure other than the silanol group is detected at 5 to 7 ppm, and hence a silanol group in an amount larger than the actual amount may be detected. The ratio of the triethoxymethylsilane or dimethyldiethoxysilane to the other constituent silane monomer incorporated is known, and therefore, from the area of methyl protons of triethoxymethylsilane or dimethyldiethoxysilane, the area of a peak assigned to the constituent silane monomer detected at 5 to 7 ppm can be estimated. When a silane monomer having a chemical shift in the same range of chemical shift as that of a silanol group was added, a net silanol amount was determined by subtracting the area of the constituent silane monomer therefrom as mentioned above.

With respect to the polymers in the Synthesis Examples and a commercially available polysilsesquioxane resin (product name: SR-13H (manufactured by Konishi Chemical Ind. Co., Ltd.; Example A3)), silanol amounts determined by the above-mentioned method are shown below.

TABLE 1

| Synthesis Example | Silanol amount relative to one Si atom (mol %) |
|---|---|
| Synthesis Example A1 | 13 |
| Synthesis Example A2 | 16 |
| SR-13H | 10 |
| Comparative Synthesis Example A1 | 35 |

[Preparation of Coating Composition]

The polymers obtained above in Synthesis Examples A1 and A2 and Comparative Synthesis Example A1, the above-mentioned SR-13H, an acid, a curing catalyst, a solvent, and ultrapure water were mixed in the respective formulations shown in Table 1 to prepare coating film forming compositions. In Table 1, the amount of the polymer added to the composition is not indicated in terms of the amount of the polymer solution added but in terms of the amount of the polymer. In Table 1, abbreviations are as follows: maleic acid is MA, N-(3-triethoxysilylpropyl)-4,5-dihydroimidazole is IMIDTEOS, 4-methyl-2-pentanol is MIBC, propylene glycol monomethyl ether acetate is PGMEA, propylene glycol monoethyl ether is PGEE, propylene glycol monomethyl ether is PGME, and ultrapure water is DIW. The amount of each component added is indicated in part(s) by mass.

TABLE 2

Table 1

| | | Preparation Example A1 | Preparation Example A2 | Preparation Example A3 | Comparative Preparation Example A1 |
|---|---|---|---|---|---|
| Polymer | Type | Synthesis Example A1 | Synthesis Example A2 | SR-13H | Comparative Synthesis Example A1 |
| | Part(s) by mass | 3 | 3 | 3 | 3 |
| Acid | Type | MA | MA | MA | MA |
| | Part(s) by mass | 0.03 | 0.03 | 0.03 | 0.03 |
| Curing catalyst | Type | IMIDTEOS | IMIDTEOS | IMIDTEOS | IMIDTEOS |
| | Part(s) by mass | 0.02 | 0.02 | 0.02 | 0.02 |
| Solvent | Type | PGME | PGME | MIBC | PGME |
| | Part(s) by mass | 5 | 5 | 100 | 5 |
| | Type | PGEE | PGEE | — | PGEE |
| | Part(s) by mass | 63 | 63 | — | 63 |
| | Type | PGMEA | PGMEA | — | PGMEA |
| | Part(s) by mass | 20 | 20 | — | 20 |
| | Type | DIW | DIW | — | DIW |
| | Part(s) by mass | 12 | 12 | — | 12 |

The results of the evaluation using the coating composition of the present invention are shown below.

[Planarization Property of Coating Composition (Evaluation of the Planarization Property on Si Substrate)]

With respect to each of the coating polysiloxane compositions in Examples A1, A2, and A3 and Comparative Example A1, the planarization property was evaluated as described below. The results of the evaluation are shown in Table 2.

Each of the coating polysiloxane compositions in Examples A1, A2, and A3 and Comparative Example A1 was applied onto a stepped substrate having a trench depth of 220 nm and a width of 800 nm using a spin coater under conditions at a rotational speed of 1,500 rpm for 60 seconds, and then dried on a hot plate at 110° C. for one minute to form a polysiloxane coating film. The polysiloxane coating film had a thickness of 90 nm. Then, As the obtained polysiloxane coating film, the form of the cross-section was observed by a SEM cross-section to evaluate the planarization property. The trench pattern having a depth of 220 nm and a width of 800 nm was examined. As the thickness of the film from the bottom of the trench as a reference point (that is, the length from the interface of the silicon substrate on the side in contact with the film to the interface of the polysiloxane coating film on the side in contact with the air), the smallest thickness and the largest thickness were measured, and a difference between the thicknesses was calculated. In the evaluation, a smaller thickness difference indicates better planarization property. The SEM photomicrographs used in the evaluation are shown in FIGS. 1 to 4.

TABLE 3

Table 2

Figure 1:
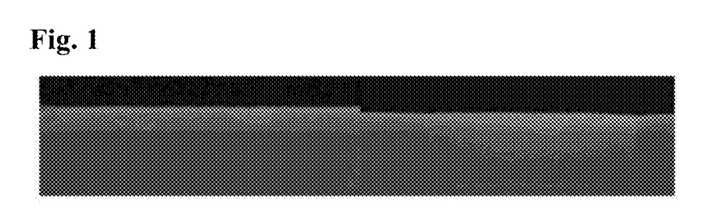
FIG. 1 A SEM photomicrograph used for evaluating the planarization property by observing the form of the cross-section with respect to the polysiloxane coating film obtained in Example A1.
Figure 2:
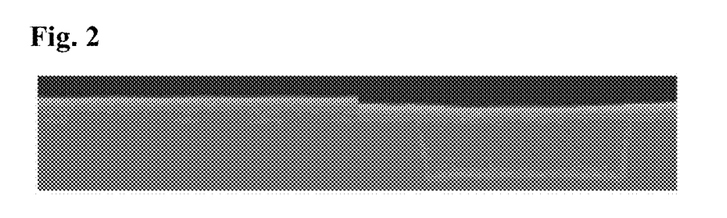
FIG. 2 A SEM photomicrograph used for evaluating the planarization property by observing the form of the cross-section with respect to the polysiloxane coating film obtained in Example A2.
Figure 3:
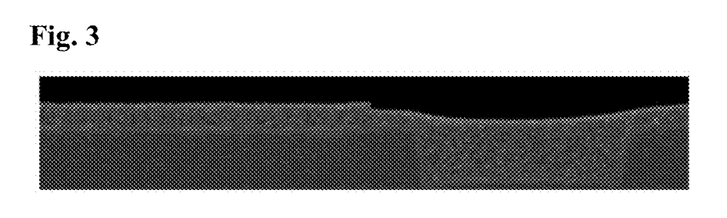
FIG. 3 A SEM photomicrograph used for evaluating the planarization property by observing the form of the cross-section with respect to the polysiloxane coating film obtained in Example A3.
Figure 4:
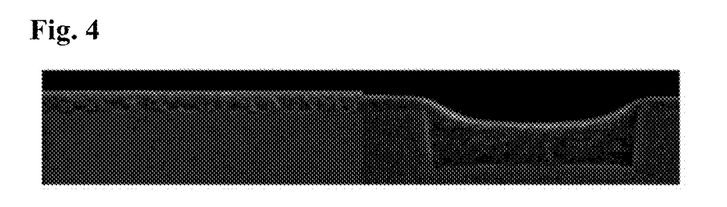
FIG. 4 A SEM photomicrograph used for evaluating the planarization property by observing the form of the cross-section with respect to the polysiloxane coating film obtained in Comparative Example A1.

| Example | Coating composition | Thickness difference (nm) | SEM Photomicrograph |
|---|---|---|---|
| Example A1 | Preparation Example A1 | 24 | FIG. 1 |
| Example A2 | Preparation Example A2 | 32 | FIG. 2 |
| Example A3 | Preparation Example A3 | 50 | FIG. 3 |
| Comparative Example A1 | Comparative Preparation Example A1 | 104 | FIG. 4 |

INDUSTRIAL APPLICABILITY

There can be provided a method for forming a coating film on a stepped substrate formed on a substrate to be processed, which is advantageous in that the formed coating film can not only advantageously fill the pattern in the stepped substrate but also be flat.

REFERENCE SIGNS LIST

1: Semiconductor substrate
2: Organic underlayer film
3: Resist composition
4: First polysiloxane coating film
5: Second polysiloxane coating film
a: Depth of the depression in the polysiloxane coating film at the center of the dense space portion
b: Depth of the depression in the polysiloxane coating film at the center of the open space portion
c: Depth of the original space in the stepped substrate used
d: Polysiloxane coating film
e: Stepped substrate

The invention claimed is:

1. A composition for organic pattern planarization, which is to be applied onto an organic pattern, the composition comprising a solvent, an organic acid, a curing catalyst and a polysiloxane, the polysiloxane consisting of a hydrolysate condensation product of a hydrolyzable silane raw material,
wherein an amount of the organic acid ranges 0.1 to 5.0 parts by mass, relative to 100 parts by mass of the hydrolysate condensation product,
wherein the polysiloxane comprises a silanol group in a proportion of 20 mol % or less relative to Si atom,
wherein the polysiloxane has a weight average molecular weight of 1,000 to 50,000,
wherein the curing catalyst is selected from the group consisting of an ammonium salt, a phosphine, a phosphonium salt, a sulfonium salt and nitrogen-containing silane compound,
wherein the hydrolyzable silane raw material consists of one or more hydrolyzable silanes represented by the following formula (1):

$R^1{}_a Si(R^2)_{4-a}$              Formula (1)

wherein $R^1$ is bonded to the silicon atom through a Si—C bonding, and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group; $R^2$ represents an alkoxy group, an acyloxy group, or a halogen group; and a represents 1, and excluding hydrolyzable silanes represented by formula (1) wherein a represents 0,
wherein the hydrolyzable silane raw material consists of 100 to 50 mol % of the hydrolyzable silane represented by formula (1) wherein a is 1, and 0 to 50 mol % of the hydrolyzable silane represented by formula (1) wherein a is 2, and
wherein the composition has a solids content, and the solids content is up to 10.0% by mass of the composition.

2. The composition according to claim 1, which additionally comprises a treatment product with a non-alcohol and a base or a weak acid of a hydrolysate condensation product of the hydrolyzable silane raw material of formula (1) wherein a is 1 or 2.

3. The composition according to claim 2, wherein the weak acid is an acid having an acid dissociation constant of 4 to 5.

4. A method for producing a semiconductor device, comprising the steps of: (1) forming an organic pattern on a substrate, (3) applying the composition according to claim 1 to the organic pattern, and (4) etching the organic pattern to remove it so that a reverse pattern remains.

5. The method according to claim 4, wherein the organic pattern is selected from a resist pattern, a nanoimprinted pattern, and an organic underlayer film pattern.

6. A method for producing a semiconductor device, comprising the steps of: (1a) forming a resist on a substrate, (2) subjecting the resist to exposure and development, (3a) applying the composition according to claim 1 to the resist pattern during or after the development, and (4a) etching the resist pattern to remove it so that a reverse pattern remains.

7. The method according to claim 4, comprising, after step (3), the step (3-1) of etching back a surface of the coating film so as to bare a surface of the organic pattern.

8. The composition according to claim 1, wherein the curing catalyst is a nitrogen-containing silane compound.

9. The composition according to claim 8, wherein the nitrogen-containing silane compound is an imidazole ring-containing silane compound.

10. The composition according to claim 9, wherein the imidazole ring-containing silane compound is N-(3-triethoxysilylpropyl)-4,5-dihydroimidazole.

11. The composition according to claim 1, wherein the polysiloxane comprises a hydrolysate condensation product of a hydrolyzable silane raw material comprising 95 to 50 mol % of the hydrolyzable silane represented by formula (1) wherein a is 1, and 5 to 50 mol % of the hydrolyzable silane represented by formula (1) wherein a is 2.

12. The composition according to claim 1, wherein the polysiloxane comprises a hydrolysate condensation product of a hydrolyzable silane raw material comprising 95 to 70 mol % of the hydrolyzable silane represented by formula (1)

wherein a is 1, and 5 to 30 mol % of the hydrolyzable silane represented by formula (1) wherein a is 2.

13. The composition according to claim 1, wherein the organic acid is selected from the group consisting of oxalic acid, malonic acid, methylmalonic acid, succinic acid, maleic acid, malic acid, tartaric acid, phthalic acid, citric acid, glutaric acid, citric acid, lactic acid, and salicylic acid.

14. The composition according to claim 1, wherein the organic acid is oxalic acid or maleic acid.

15. The composition according to claim 1, wherein the organic acid is maleic acid.

16. The composition according to claim 1, wherein the amount of the organic acid ranges 3 to 5.0 parts by mass, relative to 100 parts by mass of the hydrolysate condensation product.

* * * * *